(12) United States Patent
Hoshina

(10) Patent No.: US 8,058,668 B2
(45) Date of Patent: Nov. 15, 2011

(54) SEMICONDUCTOR LIGHT-EMITTING APPARATUS

(75) Inventor: Takaharu Hoshina, Ichihara (JP)

(73) Assignee: Showa Denko K.K., Tokyo (JP)

( * ) Notice: Subject to any disclaimer, the term of this patent is extended or adjusted under 35 U.S.C. 154(b) by 63 days.

(21) Appl. No.: 12/525,021

(22) PCT Filed: May 13, 2008

(86) PCT No.: PCT/JP2008/059098
§ 371 (c)(1), (2), (4) Date: Jul. 29, 2009

(87) PCT Pub. No.: WO2008/143201
PCT Pub. Date: Nov. 27, 2008

(65) Prior Publication Data
US 2010/0059787 A1    Mar. 11, 2010

(30) Foreign Application Priority Data
May 17, 2007    (JP) .................................. 2007-131918

(51) Int. Cl.
*H01L 33/54* (2010.01)

(52) U.S. Cl. ..................... 257/99; 257/E33.058; 438/27

(58) Field of Classification Search ................. 257/99, 257/E33.058; 438/27
See application file for complete search history.

(56) References Cited

U.S. PATENT DOCUMENTS
2003/0189830 A1 * 10/2003 Sugimoto et al. ............. 362/294

FOREIGN PATENT DOCUMENTS

| JP | 08-204239 A | 8/1996 |
| JP | 2002-094122 A | 3/2002 |
| JP | 2004-253436 A | 9/2004 |
| JP | 2005-150624 A | 6/2005 |
| JP | 2006-210677 A | 8/2006 |
| JP | 2007-005016 A | 1/2007 |

* cited by examiner

*Primary Examiner* — Steven J Fulk
(74) *Attorney, Agent, or Firm* — Sughrue Mion, PLLC

(57) ABSTRACT

An object of the present invention is to provide a light-emitting apparatus reduced in the optical self-absorption of the light-emitting device and assured of excellent light extraction efficiency. The inventive light-emitting apparatus comprises a substrate, a semiconductor light-emitting device provided on the substrate with or without intervention of a submount, and an encapsulating structure for encapsulating the semiconductor light-emitting device, wherein the encapsulating structure has a bottom parallel to the bottom of the semiconductor light-emitting device and the side surface of the encapsulating structure is tilted with respect to the bottom.

15 Claims, 9 Drawing Sheets

RATIO BETWEEN TOP DIAMETER AND BOTTOM
DIAMETER OF ENCAPSULATING STRUCTURE (a/b)

SEMICONDUCTOR LIGHT-EMITTING APPARATUS

TECHNICAL FIELD

The present invention relates to a semiconductor light-emitting apparatus. More specifically, the present invention relates to a semiconductor light-emitting apparatus assured of excellent light extraction efficiency and enabled to control the radiation dispersibility of light, in which, in order to reduce optical self-absorption of the semiconductor light-emitting device, the side surface of an encapsulating structure is tilted with respect to the bottom and a specific distance is arranged between a semiconductor light-emitting device and the top and bottom of the encapsulating structure.

BACKGROUND ART

As for the light-emitting apparatus using a semiconductor light-emitting device, there have been conventionally known, for example, a light-emitting apparatus where as shown in FIG. 1, a light-emitting device is mounted on a lead frame and the entirety is resin-encapsulated in a cannonball shape, and a light-emitting apparatus where as shown in FIG. 2, a reflector is provided on a substrate, a light-emitting device is mounted on the substrate constituting the bottom of a recess formed by the substrate and the reflector, and the inside of the recess or the entire recess is resin-encapsulated. Furthermore, in the light-emitting apparatus shown in FIG. 3, a plurality of light-emitting devices are mounted on a substrate with the intention of mass production, the surface thereof is encapsulated with a sealant or the like, and individual devices are divided by dicing or the like to have a profile of the side surface being nearly perpendicular is known (see, for example, Kokai (Japanese Unexamined Patent Publication) No. 8-78732). In the Figures, 2 indicates a light-emitting device, 4 indicates a substrate, 5 indicates a reflector, 6 indicates a sealant, 7 indicates a mounting-side lead frame, 8 indicates a power supply-side lead frame, 9 indicates a bonding wire, 10 indicates a p-electrode, and 11 indicates an n-electrode. In these light-emitting apparatus, when a material having an intermediate refractive index between the light-emitting device and the air is employed as the encapsulating material, the total reflection inside of the light-emitting device is reduced, but optical self-absorption of the light-emitting device still occurs along the beam trajectory shown by A in the Figures and this gives rise to low light extraction efficiency of almost about 1.2 to 1.5 times the efficiency when encapsulation is not applied.

Furthermore, as for the radiation intensity distribution (or luminous intensity distribution) of light in a light-emitting apparatus using the light-emitting device shown in FIG. 1 or 2, the light is concentrated in one direction mainly by providing a reflector or a lens. In addition, in the configuration of FIG. 3, the main purpose is so that energization of a device can be confirmed by lighting of the light-emitting device, and productivity of the light-emitting apparatus is important, but the light extraction is not improved.

In general, the refractive index of the light-emitting device takes a value of 2.4 to 3.7, and the refractive index of air takes a value of 1.0. A resin having a refractive index of about 1.5 intermediate therebetween is usually used for the encapsulating resin. In order to allow the light emitted from the light-emitting device to go out into air through the encapsulating resin, the angle ($\theta$) between the light incident on the encapsulating resin/air interface and the interface must be larger than the critical angle ($\theta_c$) represented by the following formula:

$$\theta_c = \cos^{-1}(n_2/n_1)$$

(wherein $n_1$ is the incidence-side refractive index and $n_2$ is the output-side refractive index).

The critical angle ($\theta_c$) calculated from the refractive index above of the encapsulating resin is about 48°, and if the angle between the interface and the incident light when measured from the interface (reflection surface) to the normal direction of the interface is less than this value, light does not go out of the encapsulating resin. Also, the p-type layer, n-type layer and active layer constituting the light-emitting device generally have a light absorptivity of approximately from $1 \times 10$ to $1 \times 10^4$/cm, and therefore particles of light that are multiply-reflected in the encapsulating resin are absorbed by the light-emitting device to inhibit the light extraction.

In the light-emitting device itself, as is known, the light extraction efficiency can be enhanced more than in the conventional nearly rectangular light-emitting device by adjusting the geometric dimension such as the height of the upper clad layer with respect to the active layer and the angle of the side surface of the device (see, for example, U.S. Pat. Nos. 6,229,160, 6,323,063 and 6,570,190). However, in the light-emitting apparatus loaded with a light-emitting device, it is not known to enhance light extraction efficiency by adjusting the geometric dimension.

DISCLOSURE OF THE INVENTION

An object of the present invention is to provide a light-emitting apparatus reduced in the optical self-absorption of the light-emitting device and assured of excellent light extraction efficiency. Another object of the present invention is to provide a light-emitting apparatus capable of dispersively radiating light. Still another object of the present invention is to provide a light-emitting apparatus capable of radiating light concentrated on the front.

In the present invention, optical self-absorption of a light-emitting device is reduced by tilting the side surface of an encapsulating structure with respect to the bottom, and the light extraction efficiency of a light-emitting apparatus is thereby enhanced. Also, in the present invention, the light-emitting apparatus is enhanced in the radiation dispersibility of light or the concentration of light on the front by designed a specific distance between a light-emitting device and the top and bottom of an encapsulating structure. That is, the present invention provides the following inventions.

(1) A light-emitting apparatus comprising a substrate, a semiconductor light-emitting device provided on the substrate with or without intervention of a submount, and an encapsulating structure for encapsulating the semiconductor light-emitting device, wherein the encapsulating structure has a bottom parallel to the bottom of the semiconductor light-emitting device and the side surface of the encapsulating structure is tilted with respect to the bottom.

(2) The light-emitting apparatus according to item 1 above, wherein the ratio between the lower distance from the bottom of the semiconductor light-emitting device to the bottom of the encapsulating structure and the upper distance from the bottom of the semiconductor light-emitting device to the top of the encapsulating structure (lower distance/upper distance) is 1 or more.

(3) The light-emitting apparatus according to item 1 above, wherein the ratio between the lower distance from the bottom of the semiconductor light-emitting device to the bottom of the encapsulating structure and the upper distance from the bottom of the semiconductor light-emitting device to the top of the encapsulating structure (lower distance/upper distance) is less than 1.

(4) The light-emitting apparatus according to any one of items 1 to 3 above, wherein the upper distance from the bottom of the semiconductor light-emitting device to the top of the encapsulating structure is from 0.5 to 3 times the longest diagonal or diameter of the semiconductor light-emitting device.

(5) The light-emitting apparatus according to any one of items 1 to 4 above, wherein the area ratio between the top and the bottom of the encapsulating structure (top/bottom) is 36/25 or more.

(6) The light-emitting apparatus according to any one of items 1 to 4 above, wherein the ratio of the corresponding side length or diameter between the top and the bottom of the encapsulating structure (top/bottom) is 6/5 or more.

(7) The light-emitting apparatus according to any one of items 1 to 4 above, wherein the angle made between the top and the side surface of the encapsulating structure is 82° or less.

(8) The light-emitting apparatus according to any one of items 1 to 4 above, wherein the area ratio between the top and the bottom of the encapsulating structure (top/bottom) is 16/25 or less.

(9) The light-emitting apparatus according to any one of items 1 to 4 above, wherein the ratio of the corresponding side length or diameter between the top and the bottom of the encapsulating structure (top/bottom) is 4/5 or less.

(10) The light-emitting apparatus according to any one of items 1 to 4 above, wherein the angle made between the top and the side surface of the encapsulating structure is 107° or more.

(11) The light-emitting apparatus according to any one of items 1 to 10 above, wherein the semiconductor light-emitting device is flip-chip type.

(12) A production method of a light-emitting apparatus, comprising the following steps (1) to (4):

(1) a step of mounting a semiconductor light-emitting device on a substrate with or without intervention of a submount, (2) a step of forming a hollow-centered ring-like tapered tube with the top and bottom satisfying the shapes of the top and bottom of the encapsulating structure according to any one of items 5 to 10 above, (3) a step of mounting the ring-like tapered tube on the substrate so that the semiconductor device and, if desired, the submount can fit into the center hollow part, and (4) a step of packing a material having the same refractive index as that of the ring-like tapered tube in the center hollow part of the ring-like tapered tube.

(13) A production method of a light-emitting apparatus, comprising the following steps (1) to (3):

(1) a step of mounting a semiconductor light-emitting device on a substrate with or without intervention of a submount, (2) a step of forming an encapsulating structure having a recess in the center part of the bottom, with the top and bottom satisfying the shapes according to any one of items 5 to 10 above, and (3) a step of fastening the encapsulating structure to the substrate with a material having the same refractive index as that of the encapsulating structure so that the semiconductor device and, if desired, the submount can fit into the recess, and at the same time, packing the material in the recess.

According to the light-emitting apparatus of the present invention, the side surface of the encapsulating structure is tilted with respect to the bottom, whereby optical self-absorption of the light-emitting device can be reduced and the light extraction efficiency of the light-emitting apparatus can be enhanced. Also, according to the light-emitting apparatus of the present invention, a specific distance is designed between a light-emitting device and the top and bottom of an encapsulating structure, whereby the light-emitting apparatus can be enhanced in the radiation dispersibility of light or the concentration of light on the font.

BEST MODE FOR CARRYING OUT THE INVENTION

Figure 14:
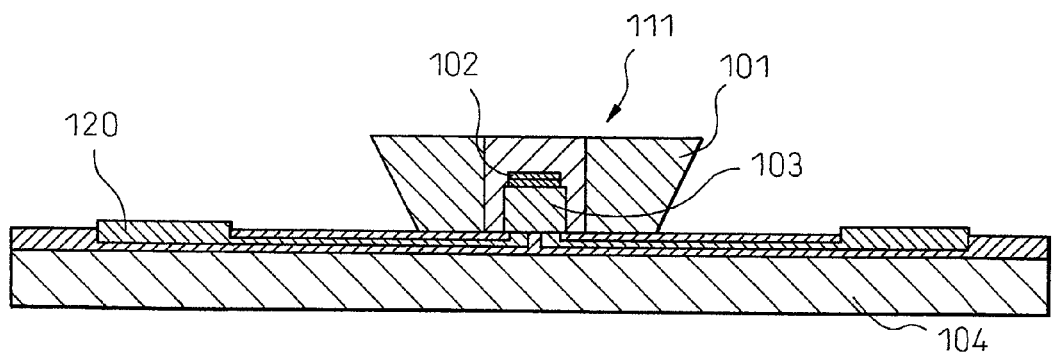
FIG. 14 is a cross-sectional view of the light-emitting apparatus produced in Example 1.
Figure 16:
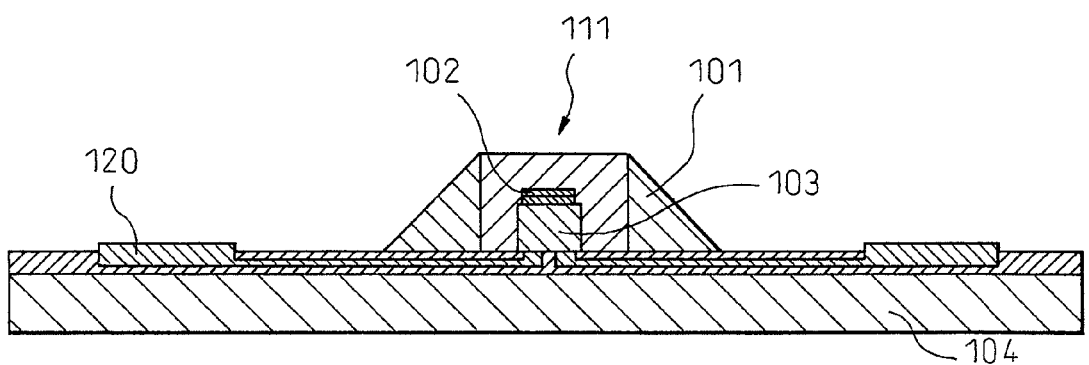
FIG. 16 is a cross-sectional view of the light-emitting apparatus produced in Example 2.

FIGS. 14 and 16 are a cross-sectional view of the light-emitting apparatus 111 produced in Example 1 and Example 2, respectively, of the present invention and each shows one example of the light-emitting apparatus of the present invention. In the Figures, 101 indicates an encapsulating structure, 102 indicates a semiconductor light-emitting device, 103 is a submount, 104 is a heat-radiating substrate, and 120 is an electrode for external power supply connection.

Figure 1:
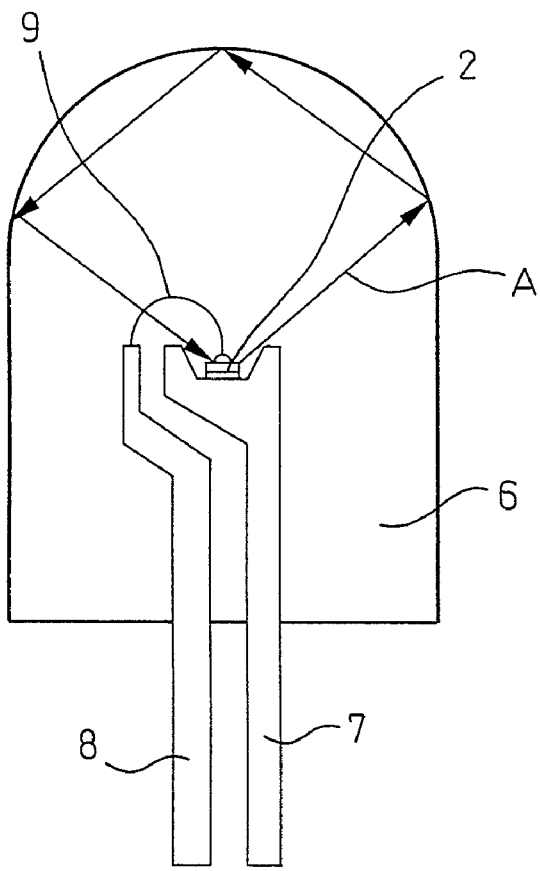
FIG. 1 is a view showing one example of the conventional light-emitting apparatus.
Figure 2:
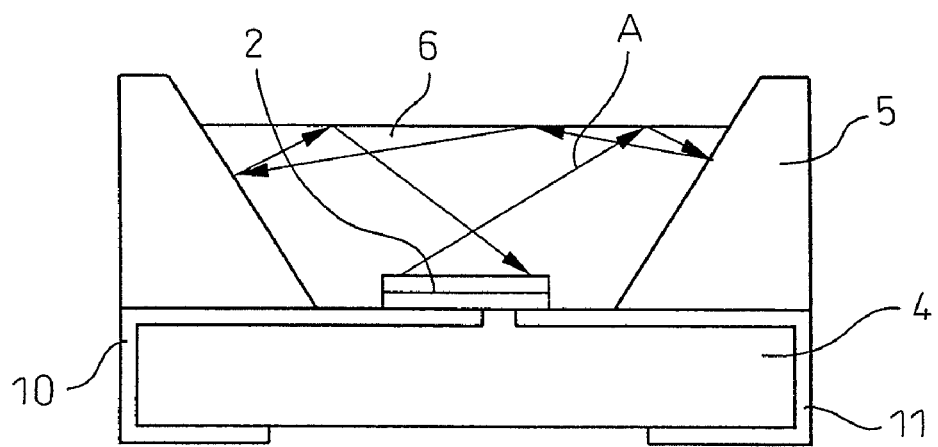
FIG. 2 is a view showing another example of the conventional light-emitting apparatus.
Figure 3:
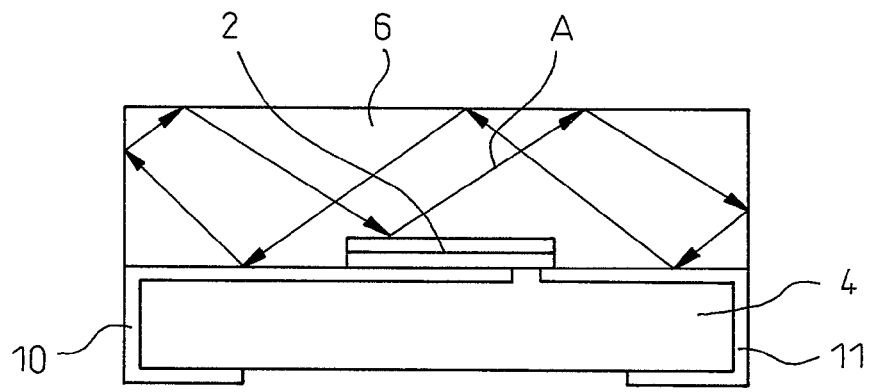
FIG. 3 is a view showing still another example of the conventional light-emitting apparatus.
Figure 4:
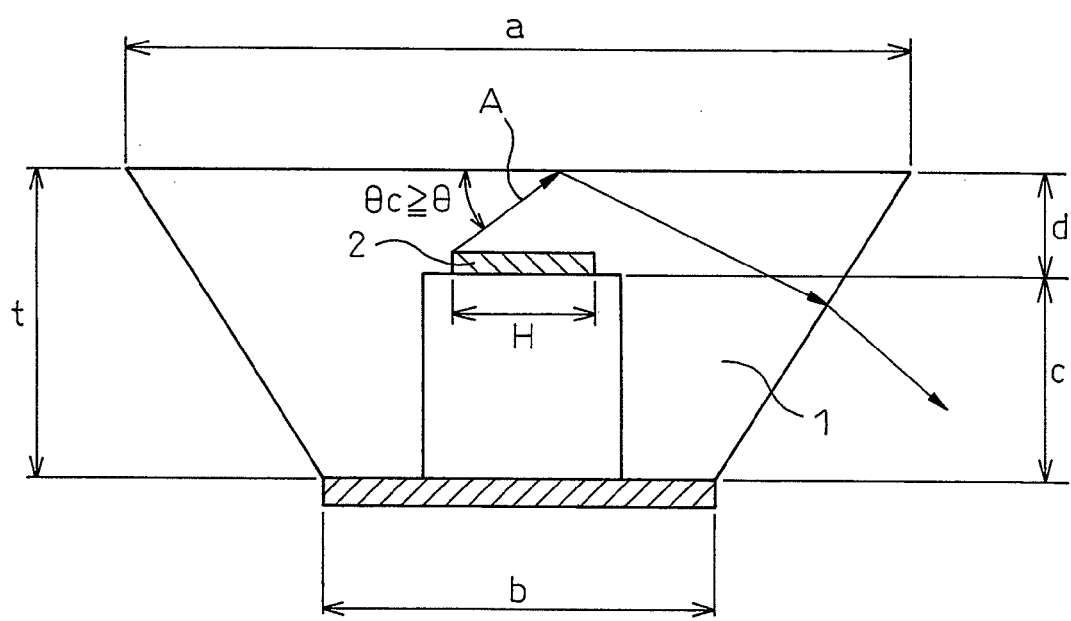
FIG. 4 is a cross-sectional view of one example of the encapsulating structure in the present invention.
Figure 5:
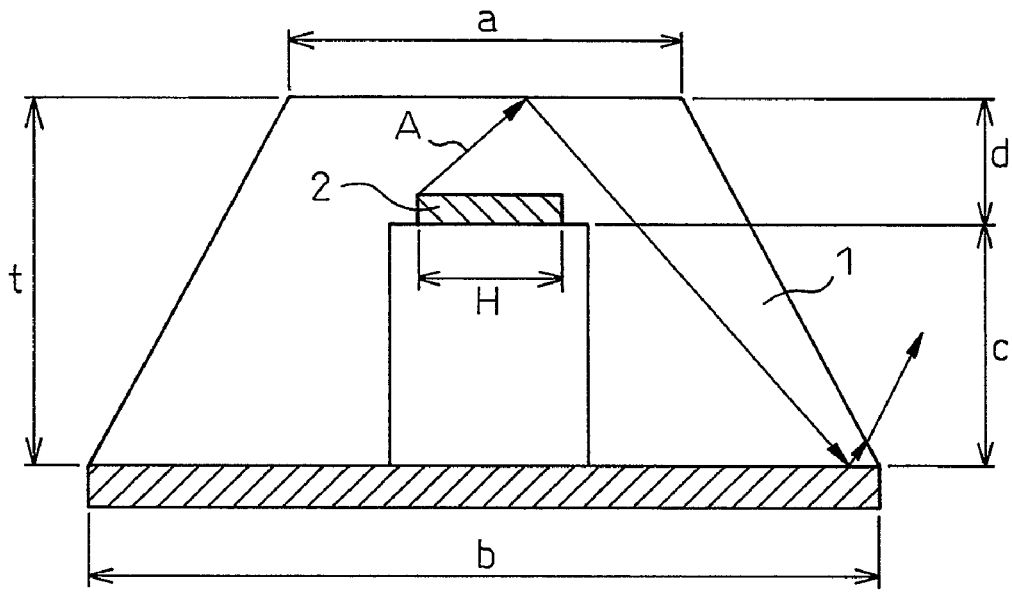
FIG. 5 is a cross-sectional view of another example of the encapsulating structure in the present invention.

FIGS. 4 and 5 are a schematic cross-sectional view of the encapsulating structure and light-emitting device portions of FIG. 14 and FIG. 16, respectively. In the Figures, 1 indicates an encapsulating structure and 2 indicates a light-emitting device. As shown in these Figures, the bottom and top of the encapsulating structure for use in the present invention are parallel to the bottom and top of the light-emitting device, and the side surface thereof is tilted with respect to the bottom. The tilt may be, as shown in FIG. 4, an inversely tapered shape where the top area is larger than the bottom area, or may be, as shown in FIG. 5, a forwardly tapered shape where the top area is smaller than the bottom area. In short, it may suffice if the side surface is not perpendicular to the bottom.

The forward tapering includes a case where the side surface is converged on one point to have a triangular cross-sectional shape, i.e., where the top area is 0. In this case, in the context of the present invention, the top of the encapsulating structure as used, for example, in the upper distance from the bottom of the semiconductor light-emitting device to the top of the encapsulating structure indicates the one point on which the side surface is converged, i.e., the peak of the cross-sectional triangle.

The encapsulating structure may have any planar shape such as square, rectangular, triangular, pentagonal or greater polygonal, or circular, but the planar shape is preferably square or circular, more preferably circular.

Summarizing the above, the inversely tapered encapsulating structure is in a truncated inversely conical or pyramidal shape, and the forwardly tapered encapsulating structure is in a truncated conical or pyramidal shape or in a conical or pyramidal shape.

By tilting the side surface of the encapsulating structure with respect to the bottom, when the radiation light (A) from the light-emitting device is totally reflected on the top of the encapsulating structure, that is, at the interface between the resin constituting the encapsulating structure and the air, as shown in FIGS. 4 and 5, the light is readily transmitted through the side surface without causing total reflection thereon. Accordingly, the light extraction efficiency is enhanced.

Figure 12:
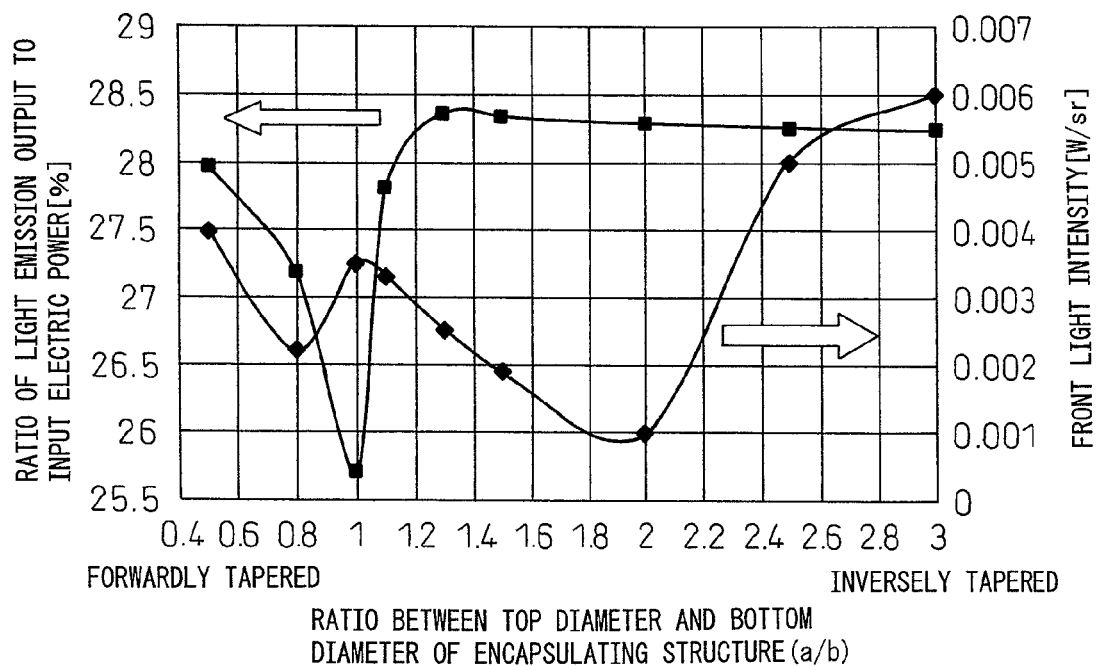
FIG. 12 is a view where the ratio of light emission output based on the input electric power and the front light intensity of the light-emitting apparatus of the present invention are plotted with respect to the ratio (a/b) between the diameter (a) of the top and the diameter (b) of the bottom of the encapsulating structure.

In FIG. 12, with respect to a light-emitting apparatus selected in Examples described later where the ratio between the lower distance from the bottom of the semiconductor light-emitting device to the bottom of the encapsulating structure and the upper distance from the bottom of the semiconductor light-emitting device to the top of the encapsulating structure (lower distance/upper distance) becomes about 3, the ratio of light emission output (left ordinate) based on the input electric power and the front light intensity (right ordinate) are plotted by using the ratio (a/b) between the diameter (a) of the top and the diameter (b) of the bottom of the encapsulating structure as the parameter (abscissa).

In FIG. 12, the abscissa value 1 (i.e., a/b=1) indicates that the top diameter and the bottom diameter are equal, i.e., the side surface of the encapsulating structure is not tilted with respect to the bottom and is perpendicular. This shape is lowest in the ratio of light emission output to the input electric power, i.e., in the light extraction efficiency. As the top diameter increases or decreases with respect to the bottom diameter, the ratio of light emission output to the input electrical power, that is, the light extraction efficiency, increases.

On the other hand, the front light intensity becomes lowest at (a/b=about 2). Since the ratio of light emission output to the input electric power, i.e., the light extraction efficiency, is generally constant at (a/b=about 1.2) or more, reduction in the front light intensity means that the light intensity in the periphery is increased, in other words, the light dispersion is enhanced.

Figure 13:
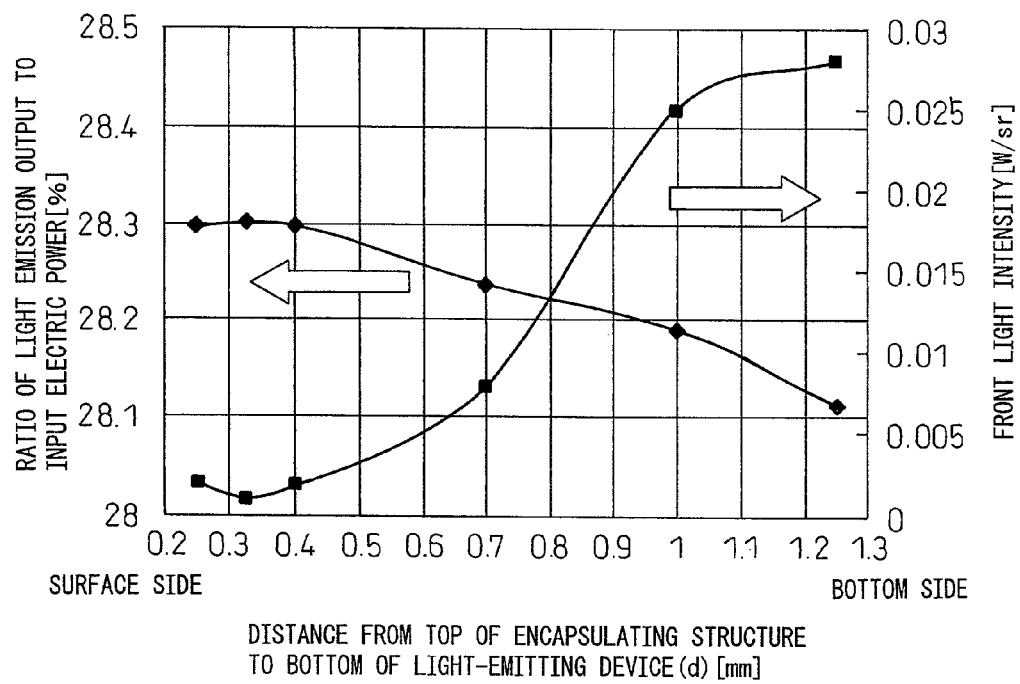
FIG. 13 is a view where the ratio of light emission output based on the input electric power and the front light intensity of the light-emitting apparatus of the present invention are plotted with respect to the distance from the top of the encapsulating structure to the bottom of the light-emitting device.

In FIG. 13, with respect to a light-emitting apparatus selected in Examples described later where the height of the encapsulating structure, i.e., the distance from the bottom to the top, is 1.3 mm and the ratio (a/b) between the top diameter (a) and the bottom diameter (b) becomes about 2, the ratio of light emission output (left ordinate) based on the input electric power and the front light intensity (right ordinate) are plotted by using the distance from the top of the encapsulating structure to the bottom of the semiconductor light-emitting device as the parameter (abscissa).

On the abscissa of FIG. 13, when the light-emitting device is located on the top side of the encapsulating structure, this is indicated as the surface side, and when located at the bottom of the encapsulating structure, this is indicated as the bottom side. The change in the ratio of light emission output to the input electric power, i.e., in the light extraction efficiency, is slight for the height at which the light-emitting device is located. On the other hand, as regards the front light intensity, when the light-emitting device is located between the vicinity of the surface and the center of the encapsulating structure, the front light intensity from the light-emitting apparatus is small and this means that the light dispersibility is excellent. Furthermore, as the position of the light-emitting device comes closer to the bottom side from the center of the encapsulating structure, the front light intensity is rapidly increased, revealing that the light dispersibility is decreased and the light concentrates on the front.

In the case where the light-emitting device is disposed in the vicinity of the surface of the encapsulating structure, i.e., when the distance d=about 0, light from the light-emitting device is totally reflected on the top of the encapsulating structure and significant light radiation through the side surface occurs. This tendency is prominent when the ratio (lower distance/upper distance) between the distance from the bottom of the light-emitting device to the bottom of the encapsulating structure (lower distance) and the distance from the top of the encapsulating structure to the bottom of the light-emitting device (upper distance) is 1.0 or more, and the dispersibility is enhanced in the light extraction from the encapsulating structure. On the other hand, when the ratio of lower distance/upper distance is less than 1.0, light from the light-emitting device is totally reflected on the side surface of the encapsulating structure and mainly radiated from the top to reduce the dispersibility, and the light concentrates on the front.

In the case of an inversely tapered encapsulating structure shown in FIG. 4 where the top area of the encapsulating structure is larger than the bottom area, i.e., the side length or diameter (a) of the top is larger than the side length or diameter (b) of the bottom, the ratio (a/b) between the side length or diameter (a) of the top and the side length or diameter (b) of the bottom is, as apparent from FIG. 12, preferably 1.1 or more because of high light extraction efficiency. The ratio is more preferably 1.2 or more (6/5 or more), still more preferably 1.3 or more. In terms of the area ratio, the ratio is preferably 1.21 or more, more preferably 1.44 or more (36/25 or more), still more preferably 1.69 or more.

In the case of fabricating a light-emitting apparatus excellent in the light dispersibility, a/b is preferably 3 or less, because the front light intensity is lowest at a/b=about 2 and increases as a/b becomes large. In view of excellence in both the extraction efficiency and the light dispersibility, a/b is more preferably about 2.

In the case of fabricating a light-emitting apparatus allowing light to concentrate on the front, a/b is preferably larger.

The side length or diameter (b) of the bottom of the encapsulating structure is sufficient if it is large enough to encapsulate the semiconductor light-emitting device and is larger than the side length or diameter (H) of the light-emitting device.

The shape of the semiconductor light-emitting device commercially available and purchasable at present is generally a square with one side being 0.35 mm, and the aperture of the light radiation part of an LED package is about 4 mm. In the encapsulating structure of the present invention, for also conforming to the conventional range of use, the upper limit for the side length of the top of the encapsulating structure may be suitably about 4.0 mm (about 11 times the longest side length or diameter of the light-emitting device). Furthermore, in order to satisfy the above-described a/b, from the standpoint of ease of production, a is preferably 2 times or more the longest side length or diameter of the light-emitting device. That is, the side length or diameter (a) of the top of the encapsulating structure is preferably $11H \geq a \geq 2H$ (H is the longest side length of the light-emitting device).

The upper distance (d) from the bottom of the semiconductor light-emitting device to the top of the encapsulating structure is preferably $3H \geq d \geq 0.5$; H (H is the longest side length or diameter of the light-emitting device). As for the distance less allowing light emitted from the light-emitting device to totally reflect on the top of the encapsulating structure and again return to the light-emitting device, the upper distance (d) is preferably 0.5 times or more, more preferably 1.0 times or more, the longest side length or diameter of the light-emitting device. Also, considering the attenuation of light in the encapsulating structure, it may be normal to set the upper limit to about 3 times the longest side length or diameter of the light-emitting device.

In the case of fabricating a light-emitting apparatus excellent in the light dispersibility, the ratio (c/d) between the lower distance (c) from the bottom of the semiconductor light-emitting device to the bottom of the encapsulating structure and the upper distance (d) from the bottom of the semiconductor light-emitting device to the top of the encapsulating structure is, as described above, 1 or more, more preferably 2 or more. Also, since the upper distance (d) is preferably 0.5 times or more the longest side length or diameter of the light-emitting device as described above, the upper limit of the ratio (c/d) may be about 6 in consideration of general sizes of the light-emitting device and encapsulating structure.

In the case of fabricating a light-emitting apparatus allowing light to concentrate on the front, the ratio (c/d) is, as described above, less than 1, preferably 0.3 or less. In this case, the ratio (c/d) does not have any particular lower limit and the semiconductor device may be directly provided on the substrate without intervention of a submount to give a ratio (c/d) of 0.

As regards a light-emitting apparatus using the encapsulating structure shown in FIG. 4 with top diameter (a)=3.2 mm, top diameter (a)/bottom diameter (b)=2.0 and height (c+d)=1.3 mm and being fabricated by encapsulating a 0.35 mm-square light-emitting device such that the distance (d) from the top of the encapsulating structure to the bottom of the light-emitting device is 0.32 mm and the distance (c) from the bottom of the light-emitting device to the bottom of the encapsulating structure is 0.98 mm, i.e., the lower distance/upper distance=about 3, light-emitting apparatus with the encapsulating structure being changed by similar reduction to 0.6 or 0.8 times or similar enlargement to 1.2 or 1.4 times starting from the center of the bottom of the light-emitting device were examined for changes in the light emission output and front light intensity. Reviewing the change in the light emission output, the light emission output was reduced nearly in a linear manner from 0.6 times where the encapsulation thickness decreases (height: 0.78 mm) to 1.4 time where the encapsulation thickness increases (height: 1.82 mm). This is considered to occur due to light absorptivity of the encapsulating resin resulting from increase in the encapsulation thickness. On the other hand, the change in the front light intensity was slight. These reveal that the increase in the encapsulation thickness leads to reduction in the light emission output but does not have much effect on the light dispersibility.

In the case of a forwardly tapered encapsulating structure shown in FIG. 5 where the top area of the encapsulating structure is smaller than the bottom area, i.e., the side length or diameter (a) of the top is smaller than the side length or diameter (b) of the bottom, the ratio (a/b) between the side length or diameter (a) of the top and the side length or diameter (b) of the bottom is, as apparent from FIG. 12, preferably 0.8 or less (4/5 or less) because of high light extraction efficiency, more preferably 0.5 or less (1/2 or less). In terms of the area ratio, the ratio is preferably 0.64 or less (16/25 or less), more preferably 0.25 or less (1/4 or less).

In the case of fabricating a light-emitting apparatus excellent in the light dispersibility, a/b is preferably 0.5 or more, because the front light intensity is lowest at a/b=about 0.8 and increases as a/b becomes small.

In the case of fabricating a light-emitting apparatus allowing light to concentrate on the front, a/b is preferably smaller, because the light extraction efficiency is excellent and the concentration of light on the front is enhanced. a/b is preferably 0.5 or less.

The side length or diameter (b) of the bottom of the encapsulating structure must be of course larger than the side length or diameter (H) of the light-emitting device in view of need to encapsulate the semiconductor light-emitting device. The upper limit thereof is suitably about 11 times (about 4.0 mm) the longest side length or diameter of the light-emitting device because of the same reason as that described above for the side length or diameter of the top of the inversely tapered encapsulating structure.

The side length or diameter (a) of the top of the encapsulating structure is sufficient if it satisfies the ratio (a/b) above with respect to the side length or diameter (b) of the bottom. In the case of forward tapering, the side surface may be converged on one point to give a triangular cross-sectional shape to the encapsulating structure. In this case, a=0.

The preferred range of the upper distance (d) from the bottom of the semiconductor device to the top of the encapsulating structure is the same as that in inverse tapering above.

Figure 6:
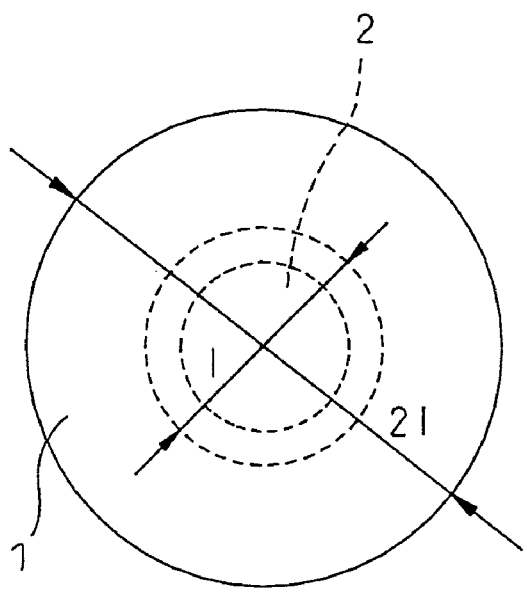
FIG. 6 is a plan view of one example of the encapsulating structure in the present invention.
Figure 7:
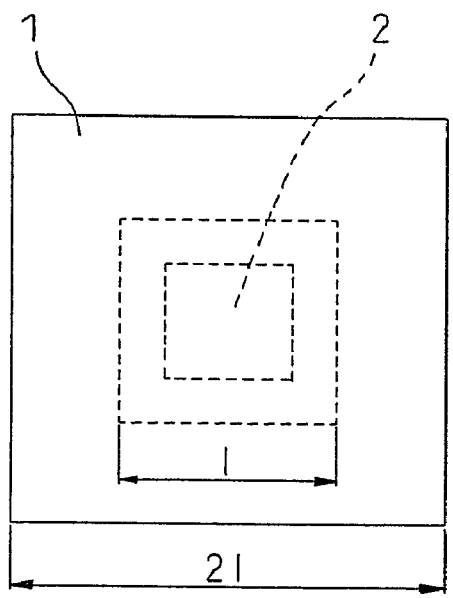
FIG. 7 is a plan view of another example of the encapsulating structure in the present invention.
Figure 8:
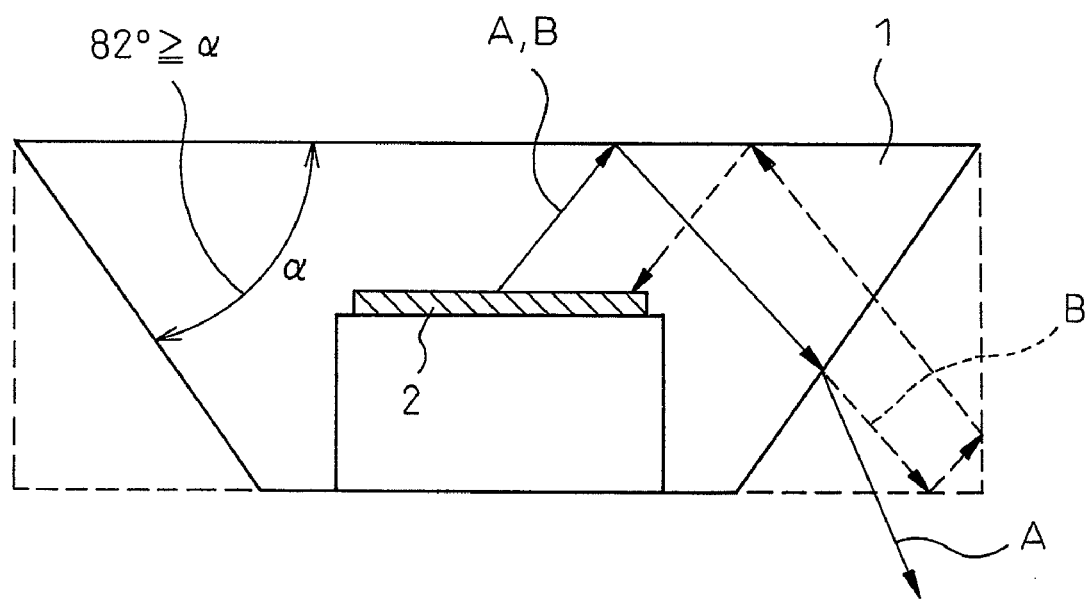
FIG. 8 is a cross-sectional view of the encapsulating structure shown in FIG. 6 or 7.

FIGS. 6 and 7 each is a plan view of one example of the encapsulating structure (1) for use in the present invention, and FIG. 8 is a cross-sectional view thereof. As in the invention described in (5) to (7) above, when the encapsulating structure has an area ratio of 36/25 or more between the top and the bottom or a ratio of 6/5 or more between respective side lengths or the angle made between the top and the side surface of the encapsulating structure is 82° or less, this is effective in view of light extraction, because coupled with the condition that the distance between the top of the encapsulating structure and the bottom of the light-emitting device is 0.5 times or more the longest diagonal or diameter of the light-emitting device, as seen in FIG. 8, the light (A) totally reflected on the top of the encapsulating structure out of light rays emitted from the light-emitting device becomes incident on the side surface at an angle greater than the critical angle and is extracted to the outside while preventing absorption of light in the inside of the encapsulating structure as well as absorption in the light-emitting device.

However, as shown by a dashed line in FIG. 8, when the area ratio between the top and the bottom of the encapsulating structure is 1:1 or the ratio between respective sides is 1:1, the majority of the light (B) totally reflected on the top of the encapsulating structure out of light rays emitted from the light-emitting device becomes incident on the side surface at an angle not greater than the critical angle and as shown by the rout B in the Figure, repeats reflection sequentially on the bottom, side surface and top of the encapsulating structure, and absorption of light in the inside of the encapsulating structure as well as in the light-emitting device is increased due to multireflection.

Figure 9:
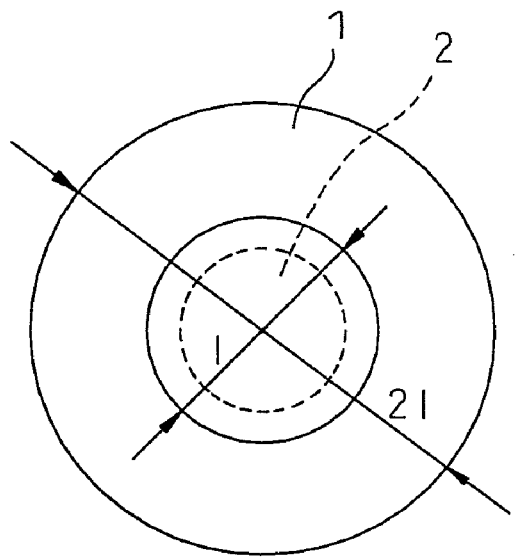
FIG. 9 is a plan view of another example of the encapsulating structure in the present invention.
Figure 10:
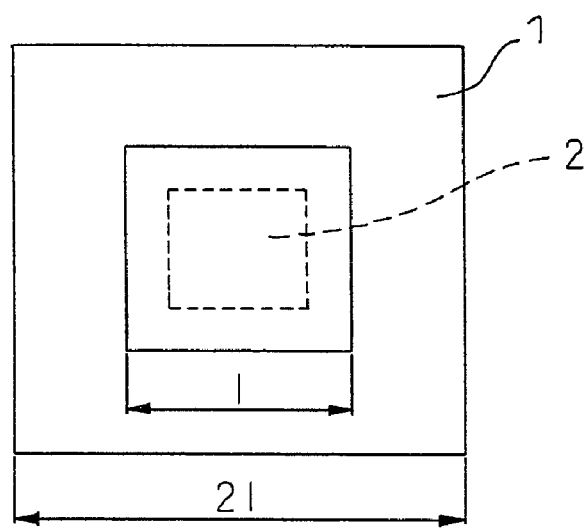
FIG. 10 is a plan view of another example of the encapsulating structure in the present invention.
Figure 11:
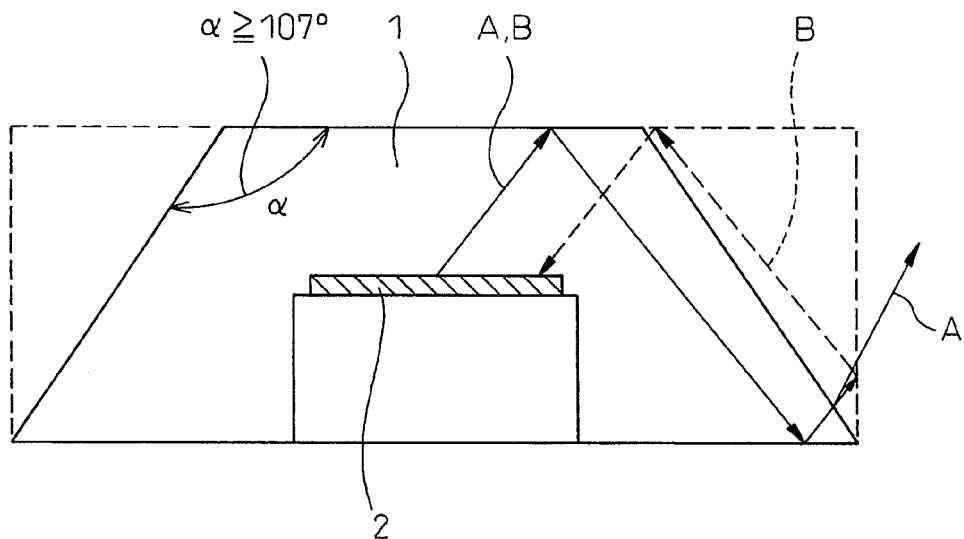
FIG. 11 is a cross-sectional view of the encapsulating structure shown in FIG. 9 or 10.

FIGS. 9 and 10 each is a plan view of another example of the encapsulating structure (1) for use in the present invention. FIG. 11 is a cross-sectional view of these structures. As in the invention described in (8) to (10) above, when the encapsulating structure has an area ratio of 16/25 or less between the top and the bottom or a ratio of 4/5 or less between respective side lengths or the angle made between the top and the side surface of the encapsulating structure is 107° or more, this is effective in view of light extraction, because coupled with the condition that the distance between the top of the encapsulating structure and the bottom of the light-emitting device is 0.5 times or more the longest diagonal or diameter of the light-emitting device, as seen in FIG. 11, the light (A) directed to the side surface of the encapsulating structure out of light rays emitted from the light-emitting device becomes incident at an angle greater than the critical angle and is extracted to the outside while preventing absorption of light in the inside of the encapsulating structure as well as absorption in the light-emitting device.

However, as shown by a dashed line in FIG. 11, when the area ratio between the top and the bottom of the encapsulating structure is 1:1 or the ratio between respective sides is 1:1, the majority of the light (B) in the same direction emitted from the light-emitting device becomes incident on the top of the encapsulating structure at an angle not greater than the critical angle and as shown by the rout B in the Figure, repeats reflection sequentially on the bottom, side surface and top of the encapsulating structure, and absorption of light in the inside of the encapsulating structure as well as in the light-emitting device is increased due to multireflection.

The members constituting the light-emitting apparatus of the present invention are described below.

The substrate on which a submount and the like are mounted may be, for example, a lead frame, a printed board or a heat-radiating substrate. In view of a large current flow to the light-emitting device, a heat-radiating substrate is preferred.

In the case of a heat-radiating substrate, a plurality of heat-radiating substrates in a size considered reasonable for the application as a light-emitting apparatus are formed from one sheet by press-working using a punching die. The shape of the heat-radiating substrate may be any shape such as rectangular, circular or polygonal. Respective shapes may also be completely punched by press-working to keep perfect independence from each other. However, a rectangular frame state created by a plurality of connected substrates, which enables loading on a mounter with streets allowing for easy separation of adjacent sides from each other, is preferred. As for the punching direction, because of a heat-radiating substrate, the punching direction is selected such that adherence to a party to be jointed together does not fail due to flipping up of the edge part after the press-working. Also, precision punching, counter die punching, vertical punching or the like with little droop of the edge part is preferred.

The heat-radiating substrate is formed from a metallic base substrate with good heat conductance, such as iron, copper or aluminum sheet, in place of the conventional electrically insulating or low heat-conductivity printed circuit board, an epoxy resin having added thereto an aluminum nitride filler agent enabling good heat conductance (hereinafter referred to as a "good heat-conducting resin layer") is coated on one surface to form an electrically insulating layer, a copper-made electrode circuit is formed thereon by etching, and if desired, a good heat-conducting resin layer is again coated as a protective layer for electrical insulation.

The substrate has a light-emitting device attaching part on which a semiconductor light-emitting device is loaded. In the case of a heat-radiating substrate, the light-emitting device attaching part is composed of an electric circuit formed using an etching technique or the like in the heat conductivity-enhanced resin part on the heat-radiating substrate. Electricity may be supplied from this electric circuit to the light-emitting device through a wire bond, or when an insulating protective film is applied between p- and n-electrodes of the light-emitting device, the electricity can be easily supplied to the light-emitting device by soldering the p- and n-electrodes of the light-emitting device to the electric circuit.

The semiconductor light-emitting device may be directly loaded on the substrate or may be loaded through a submount.

The submount is formed of an electrically insulating material, such as ceramic material, glass epoxy substrate or Si substrate with insulating protective film, and has an electric circuit on the front and back surfaces. In view of heat radiation, a ceramic material is preferred.

For example, the submount is formed by stacking a plurality of green sheet layers of aluminum nitride which is a ceramic material known as an electrically insulating member with good heat conductance. A circuit pattern is printed on the sheet surface and an electrically conductive cylindrical metal member called via is penetrated between circuits of respective layers to electrically conduct the electric circuits, whereby a submount differing in the electric circuit between the front surface and the back surface can be obtained. The stacked sheets are baked in a tunnel furnace or the like and therefore, in order to prevent cracking, a tungsten material similar in the coefficient of thermal expansion to aluminum nitride is screen-printed as the circuit. Preferably, a street is provided between individual submounts so as to form a plurality of submounts from one green sheet. Also, the surface of the tungsten part used as the circuit is preferably plated with Ni or Au for enabling good solder mounting.

In the encapsulating structure, as described above, the side surface is tilted with respect to the bottom. That is, the encapsulating structure is in a truncated inversely conical or pyramidal shape, in a truncated conical or pyramidal shape or in a conical or pyramidal shape.

A recess for attachment to a light-emitting apparatus is formed on the bottom of the encapsulating structure, and the encapsulating structure is attached so that a light-emitting device and, if desired, a submount can fit into the recess. The gap generated between the encapsulating structure and the light-emitting device is sealed with a sealant also to join together the encapsulating structure. As for the sealant, the same material as the encapsulating structure is preferably used to prevent change of the refractive index, but it is more preferred to use a sealant that cushions an impact on the light-emitting device. Examples of the material forming the encapsulating structure include an epoxy-based resin and a silicone-based resin. Among these, an epoxy-based resin is preferred in view of moldability.

The encapsulating structure is produced using such a material by the following process.

An inversely tapered or forwardly tapered mold in the above-described dimension is prepared. The material of the mold is preferably a tool steel allowing for precision mass production and having high specularity. The inner surface is lap-finished to transfer the specularity to the product. The mold has a gate, a runner and a spool and is connected to an injection molding machine, and the resin is introduced into the mold under heating and pressure. A heater is attached to a hopper part for feeding a raw material to the injection molding machine and effects dehumidification and preliminary drying. A cooling mechanism is provided in the mold and the molding is performed while adjusting the transparency degree of the product by the mold cooling temperature. A plurality of molded parts which are continuously connected through a resin channel are cut and each is subjected to finishing of the gate vestige.

In the case of a truncated inversely conical or pyramidal shape or a truncated conical or pyramidal shape, the encapsulating structure can also be produced by the following method, and this method is simple and involves a low production cost.

That is, a hollow-centered ring-like tapered tube with the top and bottom each having a predetermined shape is prepared, the light-emitting apparatus substrate is populated with the ring-like tapered tube so that the light-emitting device and, if desired, the submount can fit into the center hollow part, and a sealant is then packed in the center hollow part, whereby the encapsulating structure can be produced.

As regards the semiconductor light-emitting device for use in the present invention, light-emitting devices over a wide range, such as AlGaInP-based amber light-emitting device, AlGaAs-based red light-emitting device, AlGaInP-based red-to-yellow light-emitting device, GaP-based yellow-green light-emitting device, GaN-based green light-emitting device and GaN-based blue light-emitting device, can be used. The planar shape is generally square but is not limited and may be pentagonal or greater polygonal or may be circular. As for the electrode construction, the device has electrodes on the top and bottom or on the same plane.

Incidentally, in the light-emitting apparatus of the present invention, a reflector can be provided in the periphery of the semiconductor light-emitting device by means known in the art. When the light-emitting device is arranged on the focus of a reflector in parabolic shape, the light controllability by the reflector is enhanced and a light-emitting apparatus with high front luminance can be provided.

The procedure of fabricating the light-emitting apparatus of the present invention from the above-described constituent members is described below.

First, the light-emitting device is mounted on the substrate or submount. Examples of the method which can be employed for mounting the light-emitting device on the substrate or submount include a method where an AuSn eutectic material is vapor-deposited on the electrode part of the light-emitting device and the light-emitting device is reflowed onto the light-emitting device attaching part of the substrate or onto the submount, and a method where an Au bump is formed on the circuit part in the light-emitting attaching part of the substrate or in the submount and the light-emitting device is ultrasonically compression bonded thereto under pressure and heating. The Au material is used with awareness of two-step packaging where the substrate and the submount are mounted using a lead-free solder having a lower melting point than the Au-based solder.

Next, if desired, a submount is mounted on the substrate. The procedure is as follows.

A solder paste is printed on the submount mounting electrode part of the heat-radiating substrate by a screen printer or the like. Printing is performed in an automatic machine by placing a plurality of substrates in a cassette holder. Thereafter, a submount having mounted thereon a light-emitting device is mounted on the heat-radiating substrate by an automatic transfer machine and after melting the solder agent under heating in a reflow furnace, the temperature is lowered, thereby effecting mounting.

Finally, an encapsulating structure is mounted to embrace the light-emitting device. The procedure is as follows. The recess on the bottom of the encapsulating structure is arranged up by using a mechanism that performs vacuum or mechanical chucking of the molded encapsulating structure, and after the same resin as the encapsulating structure or a resin having a refractive index lower than that of the encapsulating structure is flowed in the recess, the encapsulating structure is attached to a predetermined site of the positioned heat-radiating substrate having mounted thereon a submount and a light-emitting device. At this time, the amount of the resin is set to an amount appropriate to fill the gap generated between the submount or light-emitting device and the encapsulating structure after subtracting the volumes of the submount and light-emitting device.

Alternatively, the ring-like tapered tube is attached to the substrate so that the light-emitting device and, if desired, the submount can fit into the center hollow part, and a sealant is then packed in the center hollow part.

As for usage, by virtue of recent development of a blue light-emitting device, the light-emitting apparatus of the present invention is applicable, for example, to a large color display used indoors or outdoors and a traffic signal. Furthermore, the light-emitting apparatus is also usable for an indoor or outdoor lighting or automotive head lamp using white LED, and its application range is widely expanded.

EXAMPLES

The present invention is described in greater detail below by referring to the Examples and Comparative Examples, but the present invention is not limited only to these Examples.

Example 1

Figure 15:
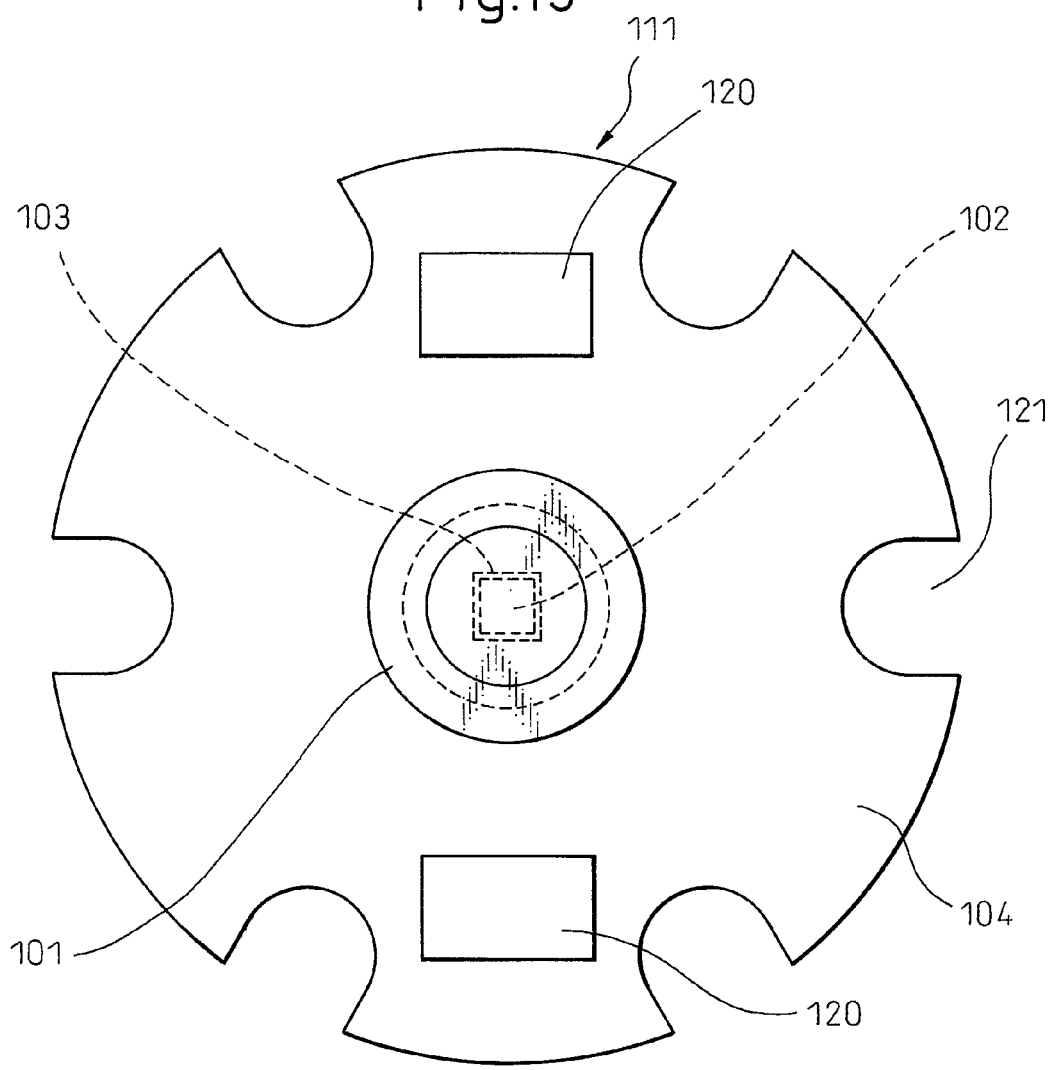
FIG. 15 is a plan view of the light-emitting apparatus produced in Example 1.

First Example of the light-emitting apparatus related to the present invention is described in detail below by referring to the drawings. FIG. 14 is a cross-sectional view of the light-emitting apparatus produced in this Example, and FIG. 15 is a plan view of the light-emitting apparatus. The light-emitting apparatus 111 is composed of a heat-radiating substrate 104, a submount 103, a semiconductor light-emitting device 102 and an encapsulating structure 101. Also, 120 is an electrode for external power supply connection, and 121 is a worked part for heat sink attachment.

The semiconductor light-emitting device 102 used is the following flip-chip type GaN-based compound semiconductor blue light-emitting device having a square shape with a side length of 0.35 mm×0.35 mm and having a thickness of about 90 μm. This light-emitting device is a light-emitting device obtained by sequentially stacking a 8 μm-thick underlying layer composed of undoped GaN, a 2 μm-thick Ge-doped n-type GaN contact layer, a 0.03 μm-thick n-type $In_{0.1}Ga_{0.9}N$ clad layer, a light-emitting layer having a multi-quantum well structure where a 16 nm-thick Si-doped GaN barrier layer and a 3 nm-thick $In_{0.2}Ga_{0.8}N$ well layer were stacked five times and a barrier layer was finally provided, a 0.01 μm-thick Mg-doped p-type $Al_{0.07}Ga_{0.93}N$ clad layer and a 0.15 μm-thick Mg-doped p-type AlGaN contact layer, on a sapphire-based substrate through an AlN-based buffer layer, and providing a positive electrode and a negative electrode on the p-type AlGaN contact layer and the n-type GaN contact layer, respectively, of the resulting gallium nitride-based compound semiconductor.

The submount 103 was produced from aluminum nitride and in order to ensure that the ratio between the lower distance from the bottom of the semiconductor light-emitting device to the bottom of the encapsulating structure and the upper distance from the bottom of the semiconductor light-emitting device to the top of the encapsulating structure (lower distance/upper distance) is 1 or more, its cross-section had a square shape with a side length of 0.5 mm×0.5 mm and a height was 0.98 mm. An electric circuit was provided to allow for electrical connection of the semiconductor device 102 with the heat-radiating substrate 104. On the submount, a GaN-based blue light-emitting device 102 was located.

In the heat-radiating substrate 104, an electrically insulating layer composed of an epoxy-based resin made to exhibit good heat conductance by blending aluminum nitride as a filler agent was provided to a thickness of 35 μm on a 1.5 mm-thick circular aluminum sheet having a diameter of 20 mm and a large heat conductivity, a Cu-made electric circuit was produced thereon by an etching method well-known in the art, and an electrically insulating layer formed of the above-described epoxy-based resin was provided as a protective layer in the encapsulating structure attaching site and the like.

The hollow-centered ring-like tapered tube constituting the encapsulating structure 101 was produced from an epoxy resin by injection molding. The center hollow part had a columnar shape with the diameter being 0.8 mm to enable housing the light-emitting device and the submount. As for the outer shape, an inversely conical shape of 1.6 mm (outer diameter of bottom)×3.2 mm (outer diameter of top)×1.3 mm (height), which is representative of the shape ensuring good light extraction efficiency and good light dispersibility, was employed. Accordingly, the ratio of the outer diameter between the top and the bottom of the encapsulating structure was (3.2/1.6=2), and the area ratio therebetween was $((3.2)^2/(1.6)^2=4)$. Also, the upper distance from the top of the encapsulating structure to the bottom of the light-emitting device was 0.32 mm, the lower distance from the bottom of the light-emitting device to the bottom of the encapsulating structure was 0.98 mm, and therefore, the lower distance/upper distance was about 3.

Using these constituent members, the light-emitting apparatus 111 was fabricated by the following procedure.

First, the light-emitting device 102 was mounted on the submount 103 through the following procedure. The submount 103 was heated and kept at about 200° C. by using a heating heater, and gold bumps were laid down by a bump pointer. As for arrangement of bumps, three gold bumps in total were arranged, that is, one in the n-electrode site with a diameter of 90 μm and two in the p-electrode site having U-shaped notches. The bump diameter was set to 80 μm so as to prevent short-circuit due to deformation of the bump at the compression bonding of the light-emitting device. As for attachment of the light-emitting device, each light-emitting device was suctioned by vacuum chucking and joined by ultrasonic compression bonding of holding it under 300 g weight at 200° C. and 138 KHz for 10 mS on the submount with bumps.

Next, the submount 103 loaded with the light-emitting device was attached to the heat-radiating substrate 104 through the following procedure. The submount was mounted on the heat-radiating substrate by using an Sn—Ag—Cu-based solder paste. For this purpose, the solder paste was coated on the heat-radiating substrate by a screen printing method. The thickness of the metal mask was set to 100 μm. As for the size of the coating region, a circular land having a diameter of 0.7 mm and having a 0.2 mm-wide insulating part for partitioning p- and n-electrodes in center was present on the surface to be mounted with the submount. The submount loaded with the light-emitting device was placed on the solder paste-coated heat-radiating substrate by a transfer robot.

The heat-radiating substrate mounted with the submount was fed to a reflow furnace by a conveyor and soldered. In the reflow furnace, two-step heating of raising the temperature to 175° C. in 80 seconds, followed by keeping it for 60 seconds, and further raising the temperature to 235° C. in 30 seconds, followed by keeping it for 30 seconds, was performed in a nitrogen atmosphere.

Subsequently, the ring-like tapered tube was adhered to the substrate with an epoxy resin so that the submount and the light-emitting device could fit in the center hollow part, and the epoxy resin was packed in the center hollow part of the ring-like tapered tube to form an encapsulating structure.

The thus-obtained light-emitting apparatus was subjected to an energization test. The voltage was 3.2 V at an input current of 20 mA. The output of the light-emitting apparatus was 18.11 mW and the ratio of the output to the input energy was 28.3%. Also, the front light intensity at this time was 0.001 [W/sr].

Incidentally, the front light intensity was measured using a luminous intensity distribution meter manufactured by Opto Science, Inc. In this measuring instrument, S5107 produced by Hamamatsu Photonics K.K. as total light quantity PD for current-light output measurement and S5821-02 produced by the same company as PD for far-field profile measurement were incorporated.

Furthermore, the light extraction quantity of the light-emitting apparatus of this Example was 1.65 times the light extraction quantity of the light-emitting device in a bare chip state.

Example 2

Figure 17:
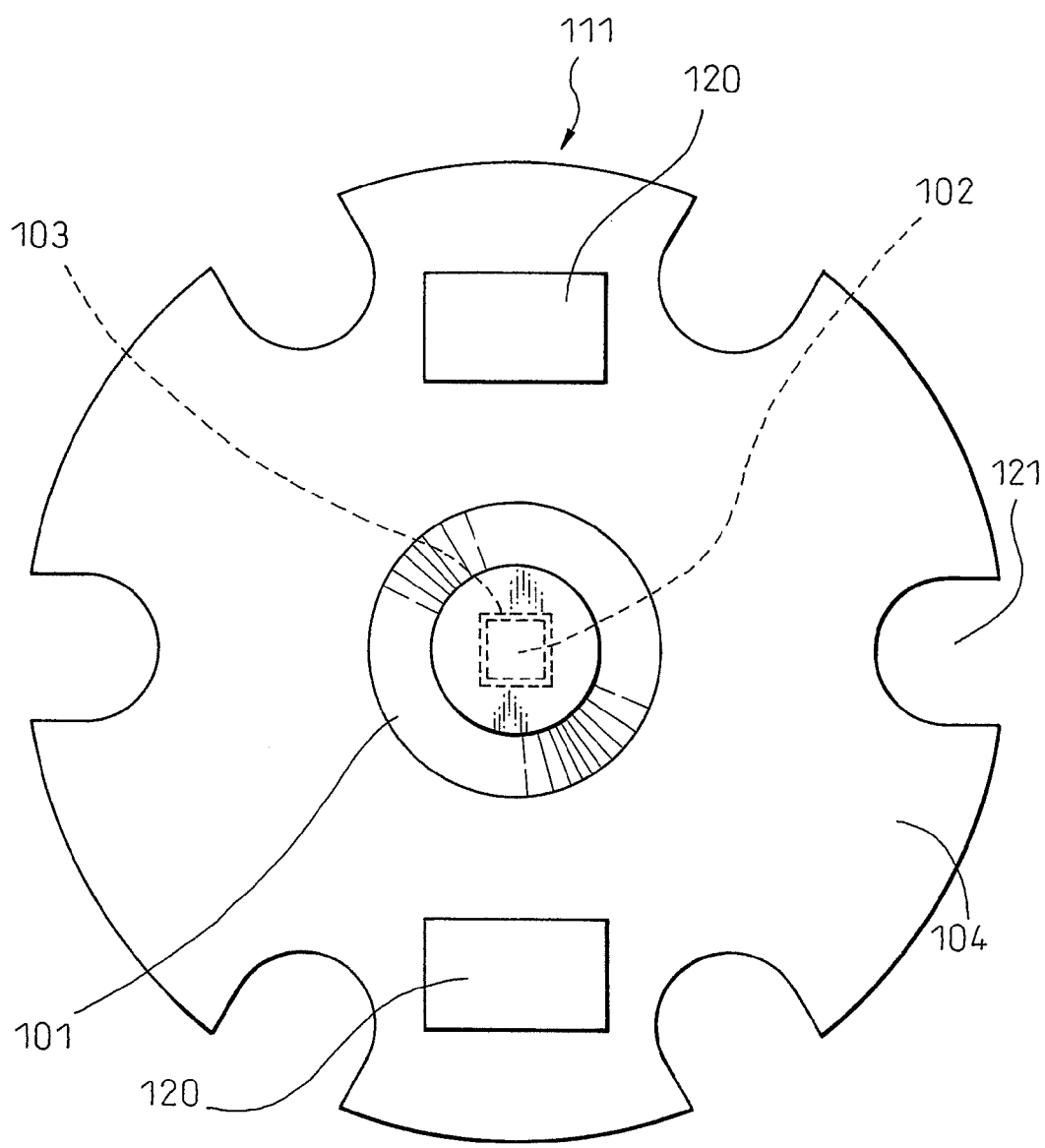
FIG. 17 is a plan view of the light-emitting apparatus produced in Example 2.

In this Example, a light-emitting apparatus was produced in the same manner as in Example 1 except that the outer diameter of the top of the ring-like tapered tube was 0.8 mm. Accordingly, the ratio of the outer diameter between the top and the bottom of the encapsulating structure of this Example was (0.8/1.6=0.5), and the area ratio therebetween was $((0.8)^2/(1.6)^2=0.25)$. FIG. 16 is a cross-sectional view of the light-emitting apparatus produced in this Example, and FIG. 17 is a plan view thereof.

The thus-obtained light-emitting apparatus was subjected to an energization test. The voltage was 3.2 V at an input current of 20 mA. The output of the light-emitting apparatus was 17.91 mW and the ratio of the output to the input energy was 27.98%. Also, the front light intensity at this time was 0.004 [W/sr]. Furthermore, the light extraction quantity of the light-emitting apparatus of this Example was 1.64 times the light extraction quantity of the light-emitting device in a bare chip state.

Comparative Example

In this Comparative Example, a light-emitting apparatus was produced in the same manner as in Example 1 except that the outer diameter of the top of the ring-like tapered tube was 1.6 mm. Accordingly, the ratio of the outer diameter between the top and the bottom of the encapsulating structure of this Example was (1.6/1.6=1), and the area ratio therebetween was $((1.6)^2/(1.6)^2=1)$.

The thus-obtained light-emitting apparatus was subjected to an energization test. The voltage was 3.2 V at an input current of 20 mA. The output of the light-emitting apparatus was 16.45 mW and the ratio of the output to the input energy was 25.70%. Also, the front light intensity at this time was 0.0035 [W/sr]. Furthermore, the light extraction quantity of the light-emitting apparatus of this Comparative Example was 1.52 times the light extraction quantity of the light-emitting device in a bare chip state.

Example 3

In this Example, a light-emitting apparatus was produced in the same manner as in Example 1, except that the outer diameter of the top of the ring-like tapered tube was 2.4 mm. Accordingly, the ratio of the outer diameter between the top and the bottom of the encapsulating structure of this Example was (2.4/1.6=1.5), and the area ratio therebetween was ((2.4)$^2$/(1.6)$^2$=2.25).

The thus-obtained light-emitting apparatus was subjected to an energization test. The voltage was 3.2 V at an input current of 20 mA. The output of the light-emitting apparatus was 18.14 mW and the ratio of the output to the input energy was 28.34%. Also, the front light intensity at this time was 0.0019 [W/sr]. Furthermore, the light extraction quantity of the light-emitting apparatus of this Example was 1.65 times the light extraction quantity of the light-emitting device in a bare chip state.

Example 4

In this Example, a light-emitting apparatus was produced in the same manner as in Example 1 except that the outer diameter of the top of the ring-like tapered tube was 4 mm. Accordingly, the ratio of the outer diameter between the top and the bottom of the encapsulating structure of this Example was (4/1.6=2.5), and the area ratio therebetween was ((4)$^2$/(1.6)$^2$=6.25).

The thus-obtained light-emitting apparatus was subjected to an energization test. The voltage was 3.2 V at an input current of 20 mA. The output of the light-emitting apparatus was 18.08 mW and the ratio of the output to the input energy was 28.25%. Also, the front light intensity at this time was 0.005 [W/sr]. Furthermore, the light extraction quantity of the light-emitting apparatus of this Example was 1.65 times the light extraction quantity of the light-emitting device in a bare chip state.

Example 5

In this Example, a light-emitting apparatus was produced in the same manner as in Example 1, except that the outer diameter of the top of the ring-like tapered tube was 4.8 mm. Accordingly, the ratio of the outer diameter between the top and the bottom of the encapsulating structure of this Example was (4.8/1.6=3), and the area ratio therebetween was ((4.8)$^2$/(1.6)$^2$=9).

The thus-obtained light-emitting apparatus was subjected to an energization test. The voltage was 3.2 V at an input current of 20 mA. The output of the light-emitting apparatus was 18.06 mW and the ratio of the output to the input energy was 28.2%, which were nearly equal to the output in the encapsulation shape of (a/b=2). Also, the front light intensity at this time was 0.006 [W/sr]. Furthermore, the light extraction quantity of the light-emitting apparatus of this Example was 1.65 times the light extraction quantity of the light-emitting device in a bare chip state.

Example 6

In this Example, a light-emitting apparatus was produced in the same manner as in Example 1 except that the outer diameter of the top of the ring-like tapered tube was 2.08 mm. Accordingly, the ratio of the outer diameter between the top and the bottom of the encapsulating structure of this Example was (2.08/1.6=1.3), and the area ratio therebetween was ((2.08)$^2$/(1.6)$^2$=1.69).

The thus-obtained light-emitting apparatus was subjected to an energization test. The voltage was 3.2 V at an input current of 20 mA. The output of the light-emitting apparatus was 18.15 mW and the ratio of the output to the input energy was 28.36%. Also, the front light intensity at this time was 0.0025 [W/sr]. Furthermore, the light extraction quantity of the light-emitting apparatus of this Example was 1.65 times the light extraction quantity of the light-emitting device in a bare chip state.

Example 7

In this Example, a light-emitting apparatus was produced in the same manner as in Example 1, except that the outer diameter of the top of the ring-like tapered tube was 1.76 mm. Accordingly, the ratio of the outer diameter between the top and the bottom of the encapsulating structure of this Example was (1.76/1.6=1.1), and the area ratio therebetween was ((1.76)$^2$/(1.6)$^2$=1.21).

The thus-obtained light-emitting apparatus was subjected to an energization test. The voltage was 3.2 V at an input current of 20 mA. The output of the light-emitting apparatus was 17.8 mW and the ratio of the output to the input energy was 27.82%. Also, the front light intensity at this time was 0.0033 [W/sr]. Furthermore, the light extraction quantity of the light-emitting apparatus of this Example was 1.63 times the light extraction quantity of the light-emitting device in a bare chip state.

Example 8

In this Example, a light-emitting apparatus was produced in the same manner as in Example 1 except that the outer diameter of the top of the ring-like tapered tube was 1.28 mm. Accordingly, the ratio of the outer diameter between the top and the bottom of the encapsulating structure of this Example was (1.28/1.6=0.8), and the area ratio therebetween was ((1.28)$^2$/(1.6)$^2$=0.64).

The thus-obtained light-emitting apparatus was subjected to an energization test. The voltage was 3.2 V at an input current of 20 mA. The output of the light-emitting apparatus was 17.4 mW and the ratio of the output to the input energy was 27.19%. Also, the front light intensity at this time was 0.0022 [W/sr]. Furthermore, the light extraction quantity of the light-emitting apparatus of this Example was 1.61 times the light extraction quantity of the light-emitting device in a bare chip state.

Example 9

In this Example, a light-emitting apparatus was produced in the same manner as in Example 1, except that the height of the submount was 1.05 mm. Accordingly, the lower distance/upper distance of this Example was (1.05/0.25=4.2).

The thus-obtained light-emitting apparatus was subjected to an energization test. The voltage was 3.2 V at an input current of 20 mA. The output of the light-emitting apparatus was 18.11 mW and the ratio of the output to the input energy was 28.3%. Also, the front light intensity at this time was 0.002 [W/sr]. Furthermore, the light extraction quantity of the light-emitting apparatus of this Example was 1.65 times the light extraction quantity of the light-emitting device in a bare chip state.

Example 10

In this Example, a light-emitting apparatus was produced in the same manner as in Example 1 except that the height of the submount was 0.90 mm. Accordingly, the lower distance/upper distance of this Example was (0.90/0.4=2.25).

The thus-obtained light-emitting apparatus was subjected to an energization test. The voltage was 3.2 V at an input current of 20 mA. The output of the light-emitting apparatus was 18.11 mW and the ratio of the output to the input energy was 28.3%. Also, the front light intensity at this time was 0.0019 [W/sr]. Furthermore, the light extraction quantity of the light-emitting apparatus of this Example was 1.65 times the light extraction quantity of the light-emitting device in a bare chip state.

Example 11

In this Example, a light-emitting apparatus was produced in the same manner as in Example 1, except that the height of the submount was 0.60 mm. Accordingly, the lower distance/upper distance of this Example was (0.60/0.70=0.86).

The thus-obtained light-emitting apparatus was subjected to an energization test. The voltage was 3.2 V at an input current of 20 mA. The output of the light-emitting apparatus was 18.07 mW and the ratio of the output to the input energy was 28.23%. Also, the front light intensity at this time was 0.008 [W/sr]. Furthermore, the light extraction quantity of the light-emitting apparatus of this Example was 1.65 times the light extraction quantity of the light-emitting device in a bare chip state.

Example 12

In this Example, a light-emitting apparatus was produced in the same manner as in Example 1 except that the height of the submount was 0.30 mm. Accordingly, the lower distance/upper distance of this Example was (0.30/1.00=0.3).

The thus-obtained light-emitting apparatus was subjected to an energization test. The voltage was 3.2 V at an input current of 20 mA. The output of the light-emitting apparatus was 18.04 mW and the ratio of the output to the input energy was 28.19%. Also, the front light intensity at this time was 0.025 [W/sr]. Furthermore, the light extraction quantity of the light-emitting apparatus of this Example was 1.65 times the light extraction quantity of the light-emitting device in a bare chip state.

Example 13

In this Example, a light-emitting apparatus was produced in the same manner as in Example 1 except that the height of the submount was 0.05 mm. Accordingly, the lower distance/upper distance of this Example was (0.05/1.25=0.04).

The thus-obtained light-emitting apparatus was subjected to an energization test. The voltage was 3.2 V at an input current of 20 mA. The output of the light-emitting apparatus was 17.99 mW and the ratio of the output to the input energy was 28.11%. Also, the front light intensity at this time was 0.028 [W/sr]. Furthermore, the light extraction quantity of the light-emitting apparatus of this Example was 1.64 times the light extraction quantity of the light-emitting device in a bare chip state.

INDUSTRIAL APPLICABILITY

The light-emitting apparatus of the present invention is improved in light extraction efficiency and assured of high light emission output and therefore, is very effective, for example, as indoor or outdoor lighting and automotive head lamps, and its industrial utility value is significantly high.

The invention claimed is:

1. A light-emitting apparatus comprising a substrate, a semiconductor light-emitting device provided on the substrate with or without intervention of a submount, and an encapsulating structure for encapsulating the semiconductor light-emitting device, wherein the encapsulating structure has a bottom parallel to the bottom of the semiconductor light-emitting device and a side surface of the encapsulating structure is tilted with respect to the bottom such that light emitted from the light-emitting device and reflected on a top surface of the encapsulating structure is transmitted through the side surface.

2. The light-emitting apparatus according to claim 1, wherein the ratio between the lower distance from the bottom of the semiconductor light-emitting device to the bottom of the encapsulating structure and the upper distance from the bottom of the semiconductor light-emitting device to the top of the encapsulating structure (lower distance/upper distance) is 1 or more.

3. The light-emitting apparatus according to claim 1, wherein the ratio between the lower distance from the bottom of the semiconductor light-emitting device to the bottom of the encapsulating structure and the upper distance from the bottom of the semiconductor light-emitting device to the top of the encapsulating structure (lower distance/upper distance) is less than 1.

4. The light-emitting apparatus according to claim 1, wherein the upper distance from the bottom of the semiconductor light-emitting device to the top of the encapsulating structure is from 0.5 to 3 times the longest diagonal or diameter of the semiconductor light-emitting device.

5. The light-emitting apparatus according to claim 1, wherein the area ratio between the top and the bottom of the encapsulating structure (top/bottom) is 36/25 or more.

6. The light-emitting apparatus according to claim 1, wherein the ratio of the corresponding side length or diameter between the top and the bottom of the encapsulating structure (top/bottom) is 6/5 or more.

7. The light-emitting apparatus according to claim 1, wherein the angle made between the top and the side surface of the encapsulating structure is 82° or less.

8. The light-emitting apparatus according to claim 1, wherein the area ratio between the top and the bottom of the encapsulating structure (top/bottom) is 16/25 or less.

9. The light-emitting apparatus according to claim 1, wherein the ratio of the corresponding side length or diameter between the top and the bottom of the encapsulating structure (top/bottom) is 4/5 or less.

10. The light-emitting apparatus according to claim 1, wherein the angle made between the top and the side surface of the encapsulating structure is 107° or more.

11. The light-emitting apparatus according to claim 1, wherein the semiconductor light-emitting device is flip-chip type.

12. A production method of a light-emitting apparatus, said apparatus comprising a substrate, a semiconductor light-emitting device provided on the substrate with or without intervention of a submount and an encapsulating structure for encapsulating the semiconductor light-emitting device, the encapsulating structure having a bottom parallel to the bottom of the semiconductor light-emitting device and a side surface of the encapsulating structure being tilted with respect to the bottom such that light emitted from the light-emitting device and reflected on a top surface of the encapsulating structure is transmitted through the side surface, said method comprising the following steps (1) to (4):

(1) a step of mounting a semiconductor light-emitting device on a substrate with or without intervention of a submount, (2) a step of forming a hollow-centered ring-like tapered tube with a top and bottom satisfying top and bottom shapes of the encapsulating structure such that the area ratio between the top and the bottom of the encapsulating structure (top/bottom) is 36/25 or more, (3) a step of mounting the ring-like tapered tube on the substrate so that the semiconductor device and, if desired, the submount can fit into the center hollow part, and (4) a step of packing a material having the same refractive index as that of the ring-like tapered tube in the center hollow part of the ring-like tapered tube.

13. A production method of a light-emitting apparatus, said apparatus comprising a substrate, a semiconductor light-emitting device provided on the substrate with or without intervention of a submount and an encapsulating structure for encapsulating the semiconductor light-emitting device, the encapsulating structure having a bottom parallel to the bottom of the semiconductor light-emitting device and a side surface of the encapsulating structure being tilted with respect to the bottom such that light emitted from the light-emitting device and reflected on a top surface of the encapsulating structure is transmitted through the side surface, said method comprising the following steps (1) to (3):

(1) a step of mounting a semiconductor light-emitting device on a substrate with or without intervention of a submount, (2) a step of forming an encapsulating structure having a recess in the center part of the bottom, with top and bottom shapes such that the area ratio between the top and the bottom of the encapsulating structure (top/bottom) is 36/25 or more, and (3) a step of fastening the encapsulating structure to the substrate with a material having the same refractive index as that of the encapsulating structure so that the semiconductor device and, if desired, the submount can fit into the recess, and at the same time, packing the material in the recess.

14. A production method of a light-emitting apparatus, said apparatus comprising a substrate, a semiconductor light-emitting device provided on the substrate with or without intervention of a submount and an encapsulating structure for encapsulating the semiconductor light-emitting device, the encapsulating structure having a bottom parallel to the bottom of the semiconductor light-emitting device and a side surface of the encapsulating structure being tilted with respect to the bottom such that light emitted from the light-emitting device and reflected on a top surface of the encapsulating structure is transmitted through the side surface, said method comprising the following steps (1) to (4):

(1) a step of mounting a semiconductor light-emitting device on a substrate with or without intervention of a submount, (2) a step of forming a hollow-centered ring-like tapered tube with a top and bottom satisfying top and bottom shapes of the encapsulating structure such that the area ratio between the top and the bottom of the encapsulating structure (top/bottom) is 16/25 or less, (3) a step of mounting the ring-like tapered tube on the substrate so that the semiconductor device and, if desired, the submount can fit into the center hollow part, and (4) a step of packing a material having the same refractive index as that of the ring-like tapered tube in the center hollow part of the ring-like tapered tube.

15. A production method of a light-emitting apparatus, said apparatus comprising a substrate, a semiconductor light-emitting device provided on the substrate with or without intervention of a submount and an encapsulating structure for encapsulating the semiconductor light-emitting device, the encapsulating structure having a bottom parallel to the bottom of the semiconductor light-emitting device and a side surface of the encapsulating structure being tilted with respect to the bottom such that light emitted from the light-emitting device and reflected on a top surface of the encapsulating structure is transmitted through the side surface, said method comprising the following steps (1) to (3):

(1) a step of mounting a semiconductor light-emitting device on a substrate with or without intervention of a submount, (2) a step of forming an encapsulating structure having a recess in the center part of the bottom, with top and bottom shapes such that the area ratio between the top and the bottom of the encapsulating structure (top/bottom) is 16/25 or less, and (3) a step of fastening the encapsulating structure to the substrate with a material having the same refractive index as that of the encapsulating structure so that the semiconductor device and, if desired, the submount can fit into the recess, and at the same time, packing the material in the recess.

* * * * *